US008957449B2

(12) United States Patent
Lee et al.

(10) Patent No.: US 8,957,449 B2
(45) Date of Patent: *Feb. 17, 2015

(54) METHOD FOR MANUFACTURING NANO-IMPRINT MOULD, METHOD FOR MANUFACTURING LIGHT-EMITTING DIODE USING THE NANO IMPRINT MOULD MANUFACTURED THEREBY, AND LIGHT-EMITTING DIODE MANUFACTURED THEREBY

(75) Inventors: Jong Lam Lee, Pohang-si (KR); Jun Ho Son, Gyeongsan-si (KR); Yang Hee Song, Seongnam-si (KR)

(73) Assignee: Postech Academy-Industry Foundation, Gyeongsangbuk-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/812,517

(22) PCT Filed: Oct. 28, 2011

(86) PCT No.: PCT/KR2011/008157
§ 371 (c)(1),
(2), (4) Date: Jan. 28, 2013

(87) PCT Pub. No.: WO2012/091270
PCT Pub. Date: Jul. 5, 2012

(65) Prior Publication Data
US 2013/0126929 A1    May 23, 2013

(30) Foreign Application Priority Data
Dec. 30, 2010   (KR) .................. 10-2010-0139089

(51) Int. Cl.
*H01L 33/00* (2010.01)
*H01L 21/18* (2006.01)
(Continued)

(52) U.S. Cl.
CPC .............. *H01L 33/32* (2013.01); *H01L 33/007* (2013.01); *H01L 21/302* (2013.01); *H01L 33/36* (2013.01);
(Continued)

(58) Field of Classification Search
CPC ......... H01L 33/00; H01L 21/18; H01L 21/00; H01L 29/06; H01L 31/0336; H01L 31/072; H01L 31/0328; H01L 31/109
USPC ...................... 257/99, E33.066, 98, E33.023, 257/E21.085, 103, E33.001, E21.001, 257/E33.065, E33.057, 100; 438/127, 26, 438/27, 46, 29, 93–94
See application file for complete search history.

(56) References Cited

U.S. PATENT DOCUMENTS

2005/0280352 A1* 12/2005 Lai ................................ 313/498
2007/0257269 A1* 11/2007 Cho et al. ........................ 257/95
(Continued)

FOREIGN PATENT DOCUMENTS

KR          10-0762004          9/2007
KR       10-2008-0000884        1/2008
(Continued)

OTHER PUBLICATIONS

International Search Report of PCT/KR2011008157 May 1, 2012.

*Primary Examiner* — David Vu
*Assistant Examiner* — Mouloucoulaye Inoussa
(74) *Attorney, Agent, or Firm* — Revolution IP, PLLC

(57) ABSTRACT

A method of manufacturing a light emitting diode, includes a process of forming an n-type nitride semiconductor layer, a light emitting layer, and a p-type nitride semiconductor layer on a temporary substrate, a process of forming a p-type electrode on the p-type nitride semiconductor layer, a process of forming a conductive substrate on the p-type electrode, a process of removing the temporary substrate to expose the n-type nitride semiconductor layer, a process of forming a nanoimprint resist layer on the n-type nitride semiconductor layer, a process of pressing the nanoimprint mold on the nanoimprint resist layer to transfer the nano-pattern onto the nanoimprint resist layer, and a process of separating the nanoimprint mold from the nanoimprint resist layer having the nano-pattern and etching a portion of the nanoimprint resist layer having the nano-pattern to form an n-type electrode.

6 Claims, 14 Drawing Sheets

(51) Int. Cl.
  *H01L 29/06* (2006.01)
  *H01L 31/109* (2006.01)
  *H01L 33/32* (2010.01)
  *H01L 21/302* (2006.01)
  *H01L 33/36* (2010.01)
  *H01L 33/22* (2010.01)
  *B82Y 40/00* (2011.01)
  *H01L 33/44* (2010.01)

(52) U.S. Cl.
  CPC ............... *H01L 33/22* (2013.01); *B82Y 40/00* (2013.01); *H01L 33/0079* (2013.01); *H01L 33/44* (2013.01); *H01L 2933/0091* (2013.01)
  USPC .................. 257/99; 257/E33.066; 257/98

(56) References Cited

U.S. PATENT DOCUMENTS

| | | | |
|---|---|---|---|
| 2008/0149916 A1* | 6/2008 | Baba et al. | 257/13 |
| 2010/0075114 A1* | 3/2010 | Kurihara et al. | 428/195.1 |
| 2010/0308359 A1* | 12/2010 | Singh et al. | 257/98 |
| 2012/0007135 A1* | 1/2012 | Yao et al. | 257/99 |
| 2012/0056355 A1* | 3/2012 | Cho et al. | 264/446 |

FOREIGN PATENT DOCUMENTS

| | | |
|---|---|---|
| KR | 10-2009-0076327 | 7/2009 |
| KR | 10-2010-0000404 | 1/2010 |
| KR | 10-2010-0011835 | 2/2010 |

* cited by examiner

METHOD FOR MANUFACTURING NANO-IMPRINT MOULD, METHOD FOR MANUFACTURING LIGHT-EMITTING DIODE USING THE NANO IMPRINT MOULD MANUFACTURED THEREBY, AND LIGHT-EMITTING DIODE MANUFACTURED THEREBY

CROSS REFERENCE TO PRIOR APPLICATIONS

This application is a National Stage Application of PCT International Patent Application No. PCT/KR2011/008157, filed on Oct. 28, 2011, under 35 U.S.C. §371, which claims priority to Korean Patent Application No. 10-2010-0139089, filed on Dec. 30, 2010, which are all hereby incorporated by reference in their entirety.

TECHNICAL FIELD

The present invention relates to a method of manufacturing a nanoimprint mold, a method of manufacturing a light emitting diode using the nanoimprint mold manufactured thereby, and the light emitting diode manufactured thereby.

BACKGROUND ART

Gallium nitride-based (GaN-based) white light emitting diodes (LEDs) have high energy conversion efficiency, long life time, strong directionality of emitted light, low operating voltage, short warm-up time, and simple operating circuit. Also, GaN-based white LEDs have durability against external shocks and vibration in order to realize high-grade light systems having various kinds of packages. Thus, GaN-based white LEDs may change outdoorlight sources to solid-state lighting such as incandescent lamps, fluorescent lamps, and mercury lamps in the near future. To utilize GaN-based LEDs as a white light source that replaces outdoor fluorescent lamps and mercury lamps, the GaN-based LEDs should emit a high efficiency of output light at a low level of consumed power and also have excellent thermal stability. Lateral type GaN-based LEDs that are widely used have a relatively low manufacturing cost and simple manufacturing process. However, they are not adapted for use as an outdoor light source because they have a high applied current and a low light output. A vertical type LEDs may solve the limitations of the lateral type LED and be easily applied to a high performance LED having a high light output in a large area. Vertical type LEDs have many advantages compared to outdoor lateral type devices. Vertical type LEDs may have a low operating voltage and a high light output because they have a low current diffused resistor and obtain a uniform current spreading. Vertical type LEDs may have a long life time and a high light output that are significantly improved because heat is easily transfer to outside through a metal or semiconductor substrate having superior thermal conductivity. Vertical type LEDs may be widely used as a white light source for lighting because they have a maximum applied current of about three or four times that of lateral type LEDs. Research and development is being actively carried out on GaN-based vertical type LED for commercialization and improved performance by leading LED companies such as NICHIA CHEMICAL CO., LTD, JAPAN, PHILIPS LUMILEDS LIGHTING COMPANY, USA, and OSRAM, GERMANY and SEOUL SEMICONDUCTOR CO., LTD, SAMSUNG ELECTRO-MECHANICS CO., LTD, and LG INNOTEK CO., LTD, Korea.

The light output of a device may be significantly improved by an n-type semiconductor layer which is placed on the top layer on the device in the manufacturing of GaN-based vertical type LEDs. In the case where the semiconductor layer has a smooth surface, total reflection occurs at the interface between the atmosphere and the semiconductor layer by means of the refractive index difference between the semiconductor and the atmosphere (the refractive index of the n-type semiconductor layer is 2.4 or less, and the refractive index of the atmosphere is 1). The device may not have a highly extracted light output because light is emitted from an active layer—i.e., the light emitting layer does not emit to the outside. Thus, minimizing loss from light guiding on semiconductor inside is required by preventing total reflection by artificially changing the semiconductor surface.

For this, in the related art, a nano structure such as a silica ($SiO_2$) nanosphere or polystyrene nanosphere is directly coated on a semiconductor layer to form a nano structure having a hemispherical shape on a surface of the semiconductor layer, and then the nano structure having the hemispherical shape is grown on the semiconductor layer by using a dry etching process to improve light extraction efficiency of the LED. However, in the above-described method according to the related art, when the nano structure is coated or etched, reproducibility may be deteriorated, and manufacturing costs may be increased. Thus, it may be difficult to manufacture a large-scale LED.

DISCLOSURE OF THE INVENTION

Technical Problem

The present invention provides a method of manufacturing a nanoimprint mold that may be efficiently and economically formed for enhancing the light extraction efficiency of a light emitting diode, a method of manufacturing a light emitting diode, and a light emitting diode using the nanoimprint module.

Also, the present invention provides a method of manufacturing a nanoimprinted light emitting diode structure that can efficiently and precisely form a nano-pattern for enhancing light extraction efficiency without using an additional wet etching and dry etching process.

Also, the present invention provides a method of manufacturing a nanoimprinted light emitting diode system that can efficiently form a nano-pattern having a large area, thereby reducing costs and simplifying the process.

Technical Solution

According to an aspect of the present invention, there is provided a method of manufacturing a nanoimprint mold, the method including: coating nano structures on the semiconductor substrate; forming a nano-pattern having a hemispherical shape on the semiconductor substrate through a dry etching process using the nano structures as masks; transferring the hemispherical-shaped nano-pattern formed on the semiconductor substrate onto a nanoimprint mold in a nanoimprinting manner; separating the nanoimprint mold on which the hemispherical shape is transferred from the semiconductor substrate.

At least one of a size and a dry etching time of each of the nano structures coated on the semiconductor substrate is adjusted to adjust a size of the nano-pattern having the hemispherical shape.

Each of the nano structures coated on the semiconductor substrate has a size of about 100 nm to about 2,000 nm.

The nano structures coated on the semiconductor substrate have sizes different from each other.

According to another aspect of the present invention, there is provided a method of manufacturing a light emitting diode, the method including: forming an n-type nitride semiconductor layer, a light emitting layer, and a p-type nitride semiconductor layer on a temporary substrate; forming a p-type electrode on the p-type nitride semiconductor layer; forming a conductive substrate on the p-type electrode; removing the temporary substrate to expose the n-type nitride semiconductor layer; forming a nanoimprint resist layer on the n-type nitride semiconductor layer; pressing the nanoimprint mold manufactured by the method of according to the present invention on the nanoimprint resist layer to transfer the hemispherical-shaped nano-pattern formed on the nanoimprint mold onto the nanoimprint resist layer; separating the nanoimprint mold from the nanoimprint resist layer having the nano-pattern having the hemispherical-shape; and etching a portion of the nanoimprint resist layer having the nano-pattern having the hemispherical-shape to form an n-type electrode.

A refractive index adjustment layer between the n-type nitride semiconductor layer and the nanoimprint resist layer, wherein the refractive index adjustment layer may has a refractive index less than that of the n-type nitride semiconductor layer and greater than that of the nanoimprint resist layer.

The refractive index adjustment layer may be formed by sequentially stacking a first refractive index adjustment layer and a second refractive index adjustment layer which refract light emitted from the light emitting layer by refractive indexes different from each other.

The first refractive index adjustment layer may be formed on the n-type nitride semiconductor layer and may have a refractive index less than that of the n-type nitride semiconductor layer, and the second refractive index adjustment layer may be formed on the first refractive index adjustment layer and may have a refractive index less than that of the first refractive index adjustment layer and greater than that of the nanoimprint resist layer.

The first refractive index adjustment layer may include at least one selected from the group consisting of ZnO, Al-doped ZnO, In-doped ZnO, Ga-doped ZnO, $ZrO_2$, $TiO_2$, $SiO_2$, SiO, $Al_2O_3$, CuOX, and ITO.

The second refractive index adjustment layer may include MgO-based oxide.

The MgO-based oxide forming the second refractive index adjustment layer may be a multinary-compound formed by adding the other elements in MgO.

The n-type electrode may be formed by depositing a conductive material on an etched area after a portion of the nanoimprint resist layer having the nano-pattern may be etched to expose the n-type nitride semiconductor layer.

According to another aspect of the present invention, there is provided a light emitting diode manufactured by the method according to another aspect of the present invention.

According to another aspect of the present invention, there is provided a method of manufacturing a light emitting diode, the method including: forming an n-type nitride semiconductor layer, a light emitting layer, and a p-type nitride semiconductor layer on a substrate on which a pattern scattering and reflecting incident light is formed; mesa-etching portions of the p-type nitride semiconductor layer, the light emitting layer, and the n-type nitride semiconductor layer to expose a portion of the n-type nitride semiconductor layer; forming a transparent electrode on the p-type nitride semiconductor layer; forming the nanoimprint resist layer on the transparent electrode; pressing the nanoimprint mold manufactured by the method of according to the present invention on the nanoimprint resist layer to transfer the hemispherical-shaped nano-pattern formed on the nanoimprint mold onto the nanoimprint resist layer; separating the nanoimprint mold from the nanoimprint resist layer having the hemispherical-shape pattern; and etching a portion of the nanoimprint resist layer having the nano-pattern having the hemispherical-shape pattern to form a p-type electrode and form an n-type electrode on the n-type nitride semiconductor layer.

The transparent electrode may include indium tin oxide (ITO).

The p-type electrode may be formed by depositing a conductive material on an etched area after a portion of the nanoimprint resist layer having the nano-pattern having the hemispherical-shape pattern is etched to expose the transparent electrode.

According to another aspect of the present invention, there is provided a light emitting diode manufactured by the method according to another aspect of the present invention.

Advantageous Effects

According to the present invention, a method of manufacturing a nanoimprint mold that can be efficiently and economically formed for enhancing the light extraction efficiency of a light emitting diode, a method of manufacturing a light emitting diode, and a light emitting diode using the nanoimprint module are made possible.

Also, the present invention allows for a method of manufacturing a nanoimprint module that can efficiently and precisely form a nano-pattern for enhancing light extraction efficiency without performing additional wet etching and dry etching processes.

Also, the present invention allows for a method of manufacturing a nanoimprint module that can efficiently form the nano-pattern having a large area, thereby reducing costs and simplifying the process.

Best Mode

An effect of improving light extraction efficiency according to the present invention will be described with reference to FIGS. 1 and 2 in comparison with the related art.

Figure 1:
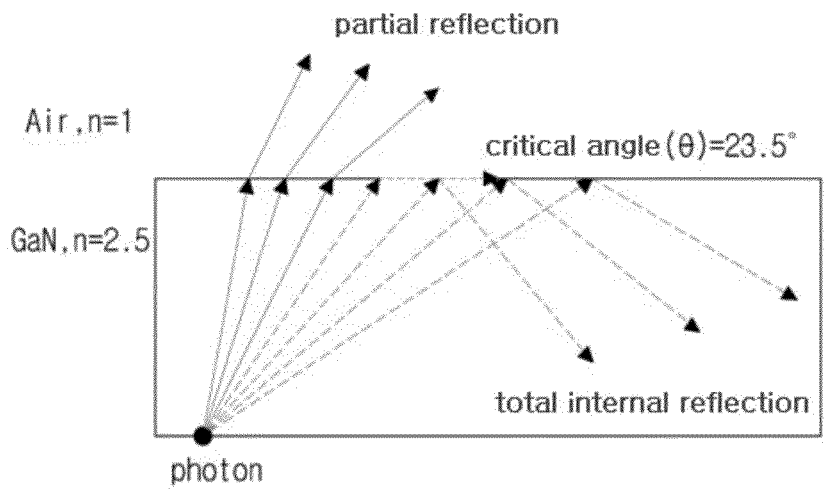
FIG. 1 is a schematic view illustrating light extraction efficiency decreased by the total internal reflection generated at an interface, due to different refractive indexes between a nitride semiconductor layer and the atmosphere, in a related art light emitting diode.

FIG. 1 is a schematic view illustrating light extraction efficiency decreased by the total internal reflection generated at an interface, due to the different refractive indexes between a nitride semiconductor layer and the atmosphere, in a related art light emitting diode.

Referring to FIG. 1, in the case where a semiconductor substrate has a smooth surface, because the refractive index of a gallium nitride semiconductor substrate is about 2.5 and the refractive index of the atmosphere is 1, a critical angle with respect to the total reflection is only 23.5 degrees because of a large refractive index difference between two layers. Thus, light emitted within a semiconductor is not emitted to the outside and is dissipated therein to decrease the light extraction efficiency.

Figure 2:
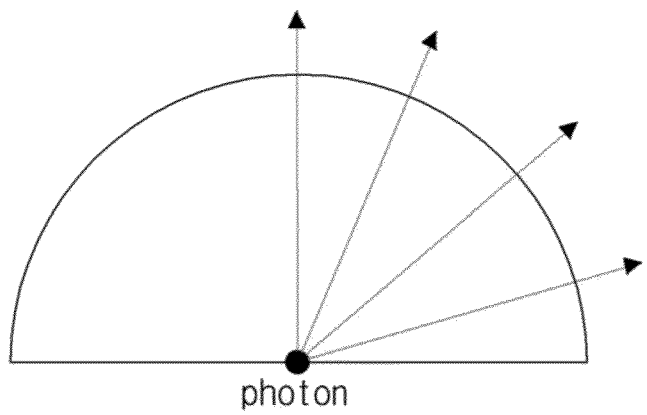
FIG. 2 is a schematic view illustrating the improvement of the light extraction efficiency of a light emitting diode according to an embodiment of the present invention by forming a nano-pattern having a hemispherical shape in a path of light.

FIG. 2 is a schematic view illustrating the improvement of the light extraction efficiency of a light emitting diode according to an embodiment of the present invention by forming a nano-pattern having a hemispherical shape in a path of light.

Referring to FIG. 2, when a nanostructure having a hemispherical shape is formed on a semiconductor surface, internal light may be significantly discharged to the outside to significantly improve light extraction efficiency of a light emitting diode because a critical angle with respect to all light emitting directions does not exist.

Reference will now be made in detail to the embodiments of the present invention, examples of which are illustrated in the accompanying drawings.

FIGS. 3 to 8 are schematic views illustrating a method of manufacturing a nanoimprint mold according to an embodiment of the present invention.

Referring to FIGS. 3 to 8, a method of manufacturing the nanoimprint mold according to an embodiment of the present invention includes a process of coating nano structures 50 on a semiconductor substrate 40, a process of forming a nano-pattern having a hemispherical shape on the semiconductor substrate 40 through a dry etching process using the nano structures 50 as a mask, a process of transferring the hemispherical-shaped nano-pattern formed on the semiconductor substrate 40 onto a nanoimprint mold 60 using a nanoimprint method, and a process of separating the nanoimprint mold 60, on which the hemispherical-shaped nano-pattern is transferred, from the semiconductor substrate 40.

Figure 3:
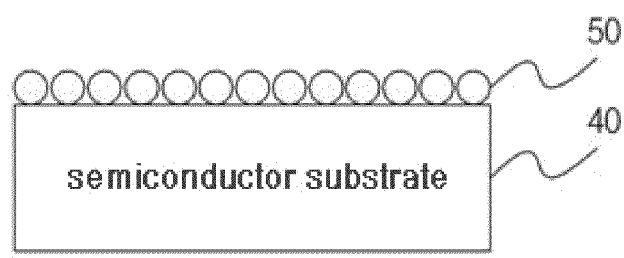
FIGS. 3 to 8 are views illustrating a method of manufacturing a nanoimprint mold according to an embodiment of the present invention.

Referring to FIG. 3, the nano structures 50 are coated onto the semiconductor substrate 40. The semiconductor substrate 40 may be formed of at least one selected from the group consisting of Si, Ge, SiC, $Si_xGe_{1-x}$, and GaN-based semiconductor. Each of the nano structures 50 may be formed of $SiO_2$ or polystyrene powder.

Figure 4:
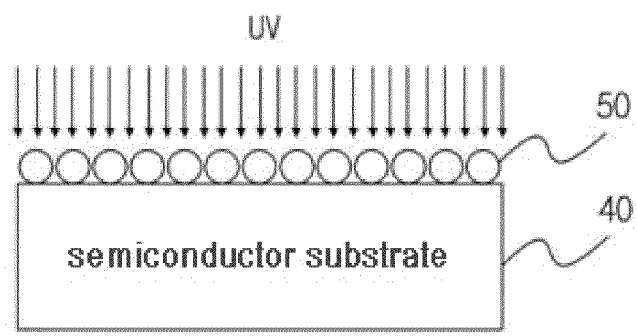
Figure 5:
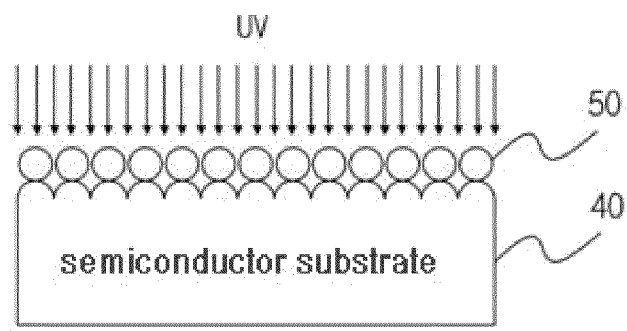
Figure 6:
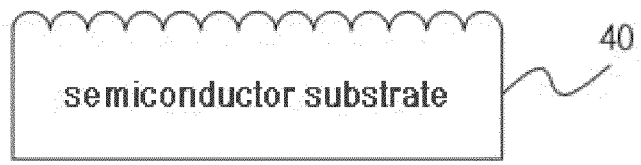

Referring to FIGS. 4 to 6, the nano-pattern having the hemispherical shape is formed on semiconductor substrate 40 through the dry etching process using the nano structures 50 coated onto the semiconductor substrate 40 as a mask. FIG. 6 illustrates the nano-pattern having the hemispherical shape formed on the semiconductor substrate 40 after exposure and developing process are performed. Although described later, a polymer mould for a nanoimprint i.e., a nanoimprint mould 60 is formed by using the semiconductor substrate 40 having the hemispherical-shaped nano pattern as a master template.

Figure 7:
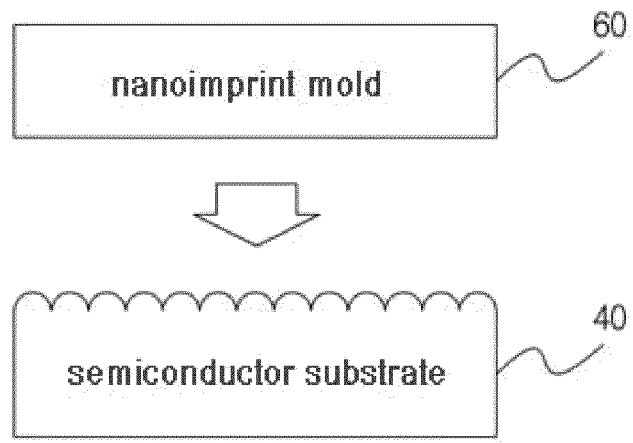

Referring to FIG. 7, the hemispherical-shaped nano pattern formed on the semiconductor substrate 40 is transferred onto the nano imprint mold 60 through the nano imprint method.

Figure 8:
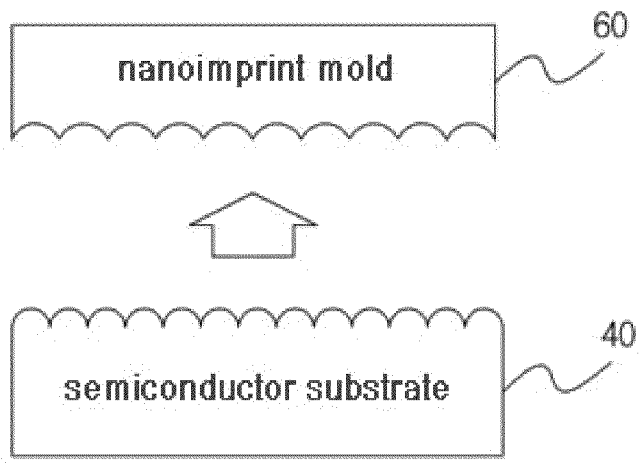

Referring to FIG. 8, the nanoimprint mold 60 on which the hemispherical-shaped nano pattern is transferred is separated from the semiconductor substrate 40.

As a result, the nanoimprint mold 60 on which the nano-pattern of the hemispherical shape is formed may be manufactured. The nanoimprint mold 60 is used as a master template for forming the nano-pattern in a process of manufacturing a light emitting diode that will be described later.

The nano-pattern having the hemispherical shape may be adjusted in size by adjusting at least one of a size and a dry etching time of the nano structure 50 coated on the semiconductor substrate 40.

Figure 9:
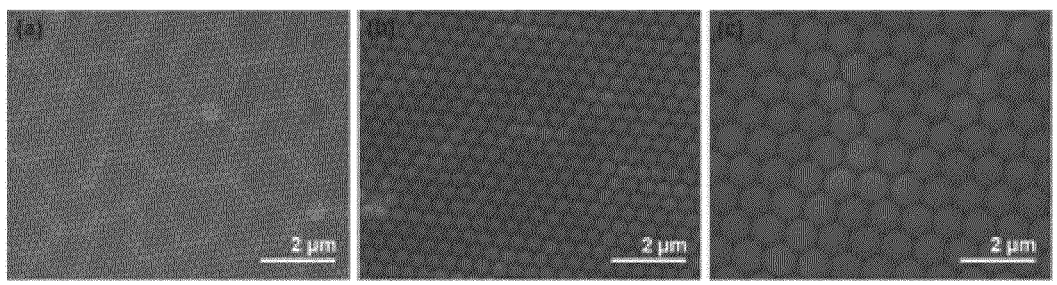
FIG. 9 is a view illustrating a photograph taken of nano structures applied onto a semiconductor substrate according to an embodiment of the present invention.

FIG. 9 is a picture photographing the nano structure 50 coated on the semiconductor substrate 40 by using an electron microscope. FIG. 9A illustrates a nano structure having a size of about 250 nm, FIG. 9B illustrates a nano structure having a size of about 500 nm, and FIG. 9C illustrates a nano structure having a size of about 1,000 nm. As described above, the nano structure coated on the semiconductor substrate may be adjusted in size to easily and efficiently adjust a size of the nano-pattern having the hemispherical shape transferred onto the nanoimprint mold.

Also, since the nano structure 50 is used as a mask in the dry etching process, the nano structure 50 coated on the semiconductor substrate 40 may have a size of about 100 nm to about 2,000 nm in consideration that a size of the nano structure 50 affects a size of the nano-pattern having the hemispherical.

Also, the nano structures 50 coated on the semiconductor substrate 40 may have sizes different from each other to form the hemispherical-shaped nano-pattern having irregular sizes.

FIGS. 10 to 18 are views illustrating a method of manufacturing a light emitting diode according to a first embodiment of the present invention.

Referring to FIGS. 10 to 18, a method of manufacturing a light emitting diode according to a first embodiment of the present invention includes a process of forming an n-type nitride semiconductor layer 110, a light-emitting layer 120, and a p-type nitride semiconductor layer 130 on a temporary substrate 100, a process of forming a p-type electrode 140 on the p-type nitride semiconductor layer 130, a process of forming a conductive substrate 150 on the p-type electrode 140, a process of exposing the n-type nitride semiconductor layer 110 by removing the n-type nitride semiconductor layer 110, a process of forming a nanoimprint resist layer 160 on the n-type nitride semiconductor layer 110, a process for transferring a hemispherical-shaped nano-pattern transferred onto the nanoimprint resist layer 160 by pressing a nanoimprint mold 60 that is formed by the method of manufacturing a nanoimprint mold according to the present invention on the nanoimprint resist layer 160, a process of separating the nanoimprint mold from the nanoimprint resist layer 160 having the hemispherical-shaped nano-pattern, and a process of forming an n-type electrode 170 by etching a portion of the nanoimprint resist layer 160 having the hemispherical-shaped nano-pattern.

Figure 10:
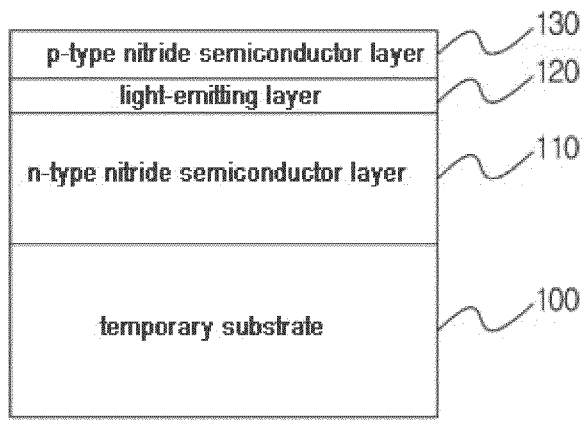
FIGS. 10 to 18 are views illustrating a method of manufacturing a light emitting diode according to a first embodiment of the present invention.

Referring to FIG. 10, the n-type nitride semiconductor layer 110, the light-emitting layer 120, and the p-type nitride semiconductor layer 130 are sequentially formed on the n-type nitride semiconductor layer 110.

Figure 11:
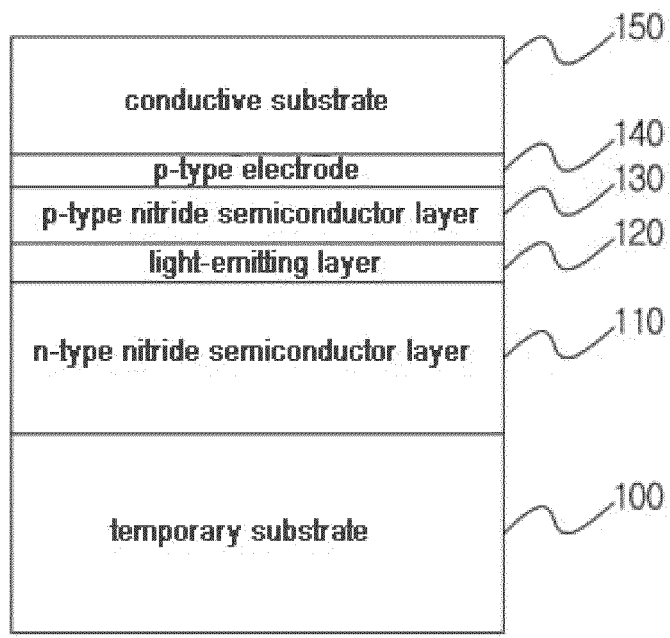

Referring to FIG. 11, the p-type electrode 140 is formed on the p-type nitride semiconductor layer 130, and the conductive substrate 150 is formed in the p-type electrode 140. The p-type electrode 140 also performs a function that reflects light from the light-emitting layer 120.

Figure 12:
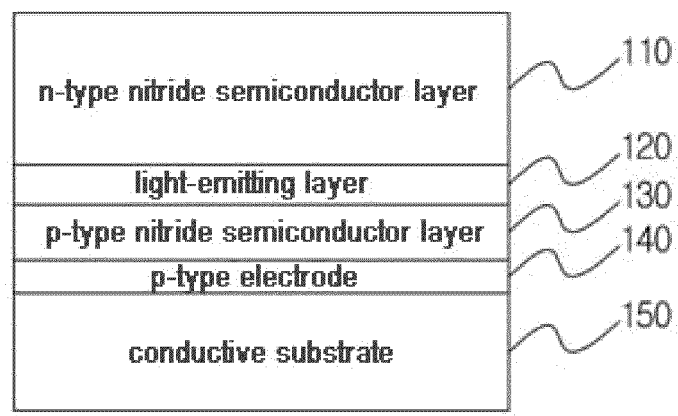

Referring to FIG. 12, the n-type nitride semiconductor layer 110 is exposed to the outside by removing the temporary substrate 100.

Figure 13:
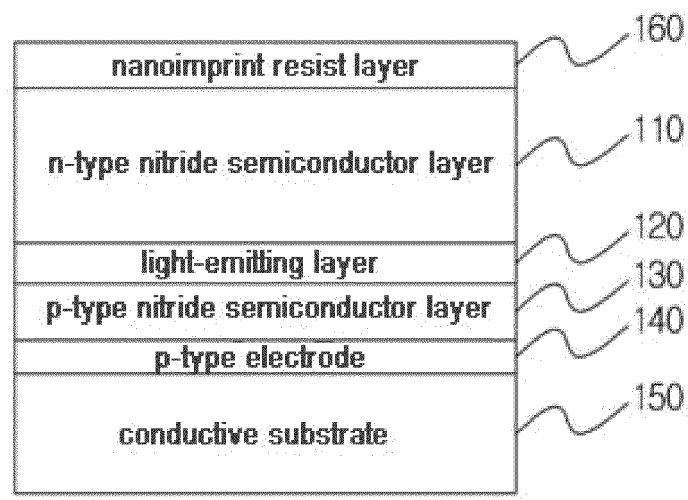

Referring to FIG. 13, the nanoimprint resist layer 160 is formed on the n-type nitride semiconductor layer 110 by the spin coating method, for example.

Figure 14:
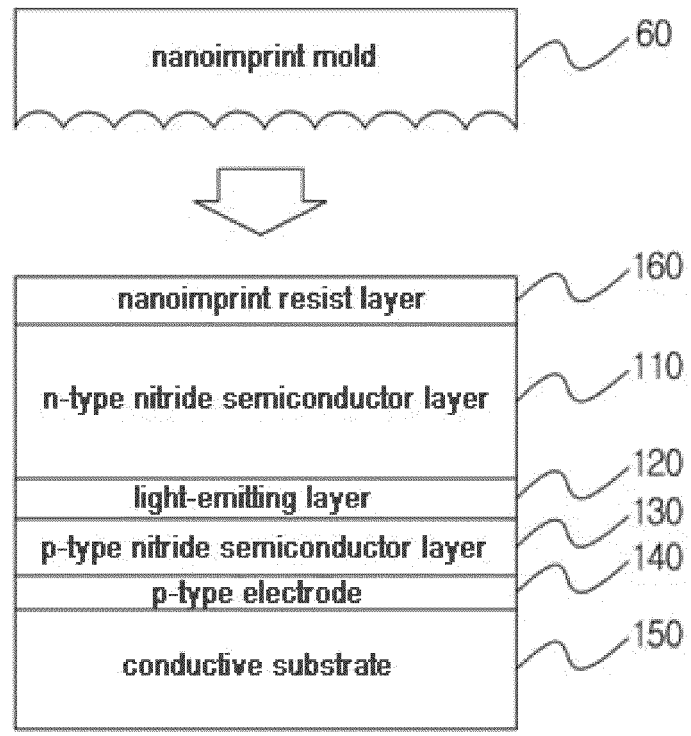
Figure 15:
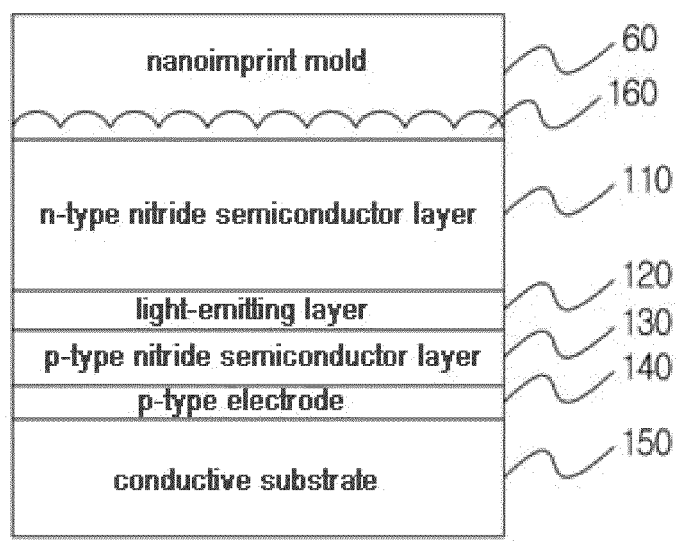

Referring to FIGS. 14 and 15, the nanoimprint mold 60 manufactured by the above-described method of manufacturing the nanoimprint mold according to an embodiment of the present invention is pressed onto the nanoimprint resist layer 160 to transfer the nano-pattern onto on the nanoimprint resist layer 160. Then, UV rays and heat are applied into the transferred nanoimprint resist layer 160 to cure the nanoimprint resist layer 160 having the hemispherical-shaped nano-pattern.

Figure 16:
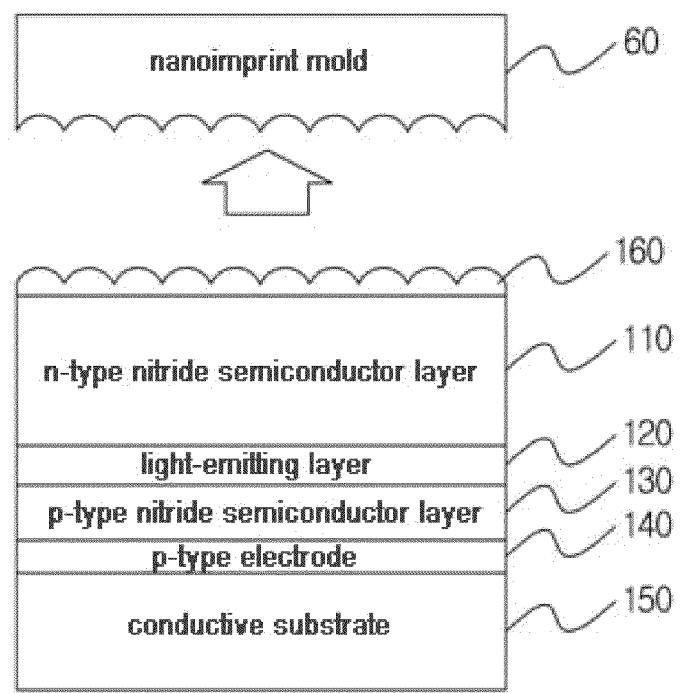

Referring to FIG. 16, the nanoimprint mold 60 is separated from the nanoimprint resist layer 160 having the hemispherical-shaped nano-pattern.

Figure 17:
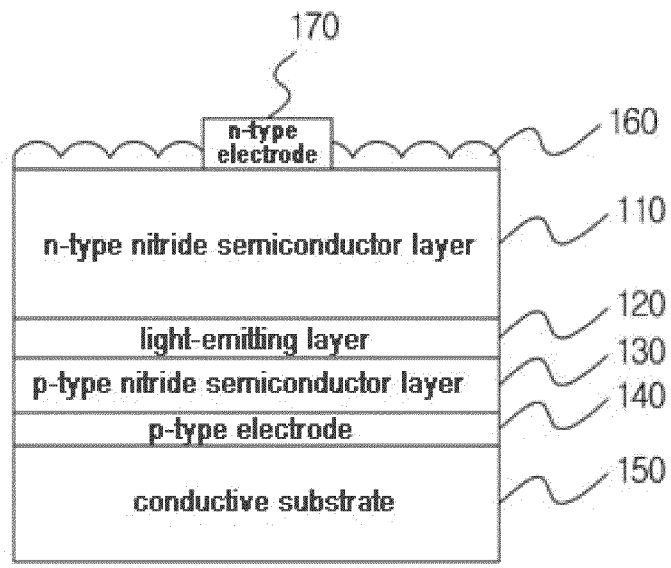

Referring to FIG. 17, a portion of the nanoimprint resist layer 160 having the hemispherical-shaped nano-pattern is etched for exposing the n-type nitride semiconductor layer 110, and then the n-type electrode 170 is formed. For example, the n-type electrode 170 etches a portion of the nanoimprint resist layer 160 having the hemispherical-shaped nano-pattern to expose the n-type nitride semiconductor layer 110, and may then be formed on an etched region by removing a conductive material.

Also, the first embodiment of the present invention may include a process of additionally forming a refractive index adjustment layer 180 for enhancing the light extraction efficiency.

Figure 18:
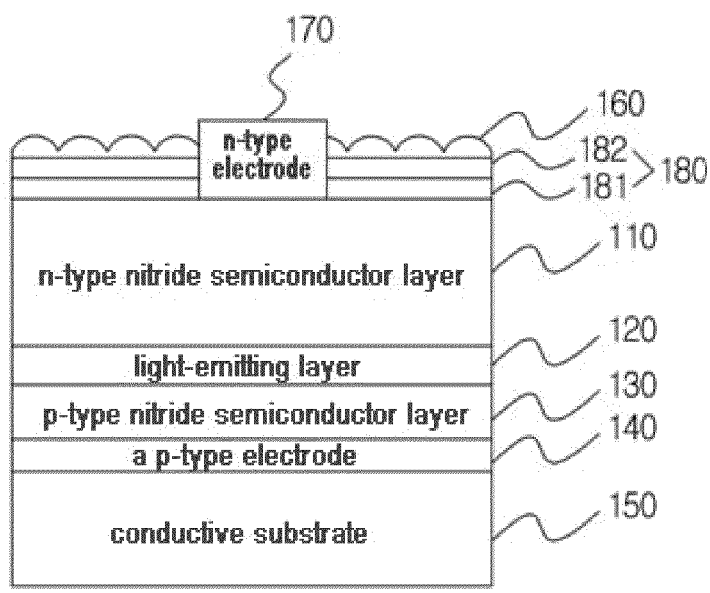

That is, referring to FIG. 18, the refractive index adjustment layer 180 is formed having a lower refractive index than the refractive index of the n-type nitride semiconductor layer 110 and higher than the refractive index of the nanoimprint resist layer 160 between the n-type nitride semiconductor layer 110 and nanoimprint resist layer 160 before forming the nanoimprint resist layer 160.

The refractive index adjustment layer 180 is sequentially formed by stacking the first refractive index adjustment layer 181 and the second refractive index adjustment layer 182 which reflect emitted light from the light-emitting layer 120 and having the same refractive index.

The first refractive index adjustment layer 181 is formed on the n-type nitride semiconductor layer 110 such that the refractive index of the first refractive index adjustment layer 181 is lower than the refractive index of the n-type nitride semiconductor layer 110, the second refractive index adjustment layer 182 is formed on the first refractive index adjustment layer 181 such that the refractive index of the second refractive index adjustment layer 182 is lower than the refractive index of the first refractive index adjustment layer 181 and is higher than the refractive index of the nanoimprint resist layer 160. The first refractive index adjustment layer 181 and the second refractive index adjustment layer 182 have an intermediate refractive index between those of the n-type nitride semiconductor layer 110 and the nanoimprint resist layer 160 to perform the function of a buffer layer, thereby further enhancing light extraction efficiency.

For example, the first refractive index adjustment layer 181 may include at least one selected from the group consisting of ZnO, Al-doped ZnO, In-doped ZnO, Ga-doped ZnO, $ZrO_2$, $TiO_2$, $SiO_2$, SiO, $Al_2O_3$, CuOX, and ITO, and the second refractive index adjustment layer 182 may include MgO-based oxide. The MgO-based oxide forming the second refractive index adjustment layer 182 may be a multinary compound formed by adding the other elements in MgO. All of the materials have a refractive index between the refractive index of the n-type nitride semiconductor layer 110 and the refractive index of the nanoimprint resist layer 160 selected from the first refractive index adjustment layer 181 and the second refractive index adjustment layer 182.

As described in detail above, the present invention allows for a method of manufacturing a nanoimprint mold that can be efficiently and economically formed for enhancing the light extraction efficiency of a light emitting diode, a method of manufacturing a light emitting diode, and a light emitting diode using the nanoimprint module.

Also, the present invention allows for a method of manufacturing a nanoimprint module that can efficiently and precisely form a nano-pattern for enhancing light extraction efficiency without using an additional wet etching and dry etching process.

Also, the present invention allows for a method of manufacturing a nanoimprint module that can efficiently form a nano-pattern having a large area, thereby reducing costs and simplifying the process.

In more detail, the technique of the present invention, as a process for forming a hemispherical nanostructure using a method of nanoimprinting a large area, may be immediately applicable to a manufacturing process of the light emitting diode. Moreover, the technique of the present invention may be applicable to a vertical or lateral type light emitting diode. According to the technique of the present invention, a manufacturing process may become simpler, and the light output of a light emitting diode may be drastically improved. The present invention relates to an energy saving eco friendly technique that welcomes a solid-state lighting age using white light GaN-based LEDs.

Mode for Carrying Out the Invention

FIGS. 19 to 25 are views illustrating a method of manufacturing a light emitting diode according to a second embodiment of the present invention.

Referring to FIGS. 19 to 25, a method of manufacturing a light emitting diode according to a second embodiment includes a process of forming an n-type nitride semiconductor layer 210, a light-emitting layer 220, and a p-type nitride semiconductor layer 230 on a semiconductor substrate 200 having a pattern for reflecting light through scattering, a process of exposing a portion of the n-type nitride semiconductor layer 210 by mesa-etching a portion of the p-type nitride semiconductor layer 230, the light-emitting layer 220, and the p-type nitride semiconductor layer 230, a process of forming a transparent electrode layer 240 on the p-type nitride semiconductor layer 230, a process of forming a nanoimprint resist layer 250 on the transparent electrode layer 240, a process of transferring a nano-pattern transferred onto a nanoimprint resist layer 250 by pressing the nanoimprint resist layer 250 that is formed by the method of manufacturing a nanoimprint module according to the present invention on the nanoimprint resist layer 250, a process of separating the nanoimprint mold 60 from the nanoimprint resist layer 250 having the nano-pattern, and a process of forming a p-type electrode 260 by etching a portion of the nanoimprint resist layer 250 having the nano-pattern and forming an n-type electrode 270 on the n-type nitride semiconductor layer 210.

Figure 19:
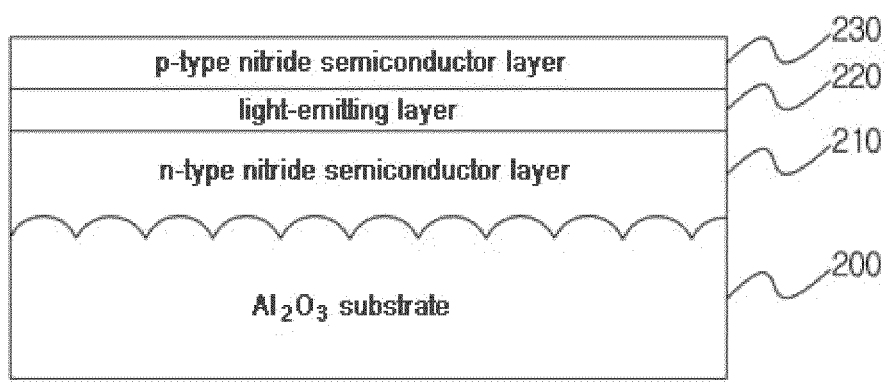
FIGS. 19 to 25 are views illustrating a method of manufacturing a light emitting diode according to a second embodiment of the present invention.

Referring to FIG. 19, the n-type nitride semiconductor layer 210, the light-emitting layer 220, and the p-type nitride semiconductor layer 230 are sequentially formed on a substrate 200 having a nano-pattern for reflecting incident light. The substrate 200 may be a substrate formed of sapphire ($Al_2O_3$), and the nano-pattern formed on the substrate 200 performs a function for reflecting emitting light through scattering from the light-emitting layer 220.

Figure 20:
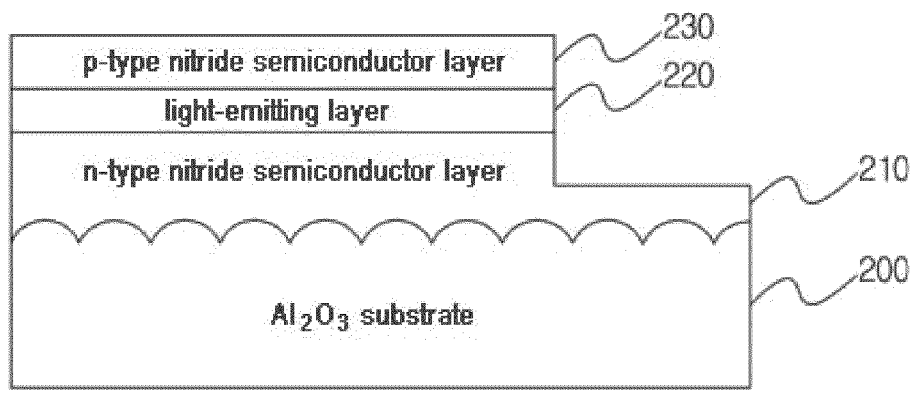

Referring to FIG. 20, a portion of the n-type nitride semiconductor layer 210 is exposed by mesa-etching a portion of the p-type nitride semiconductor layer 230, the light-emitting layer 220, and the n-type nitride semiconductor layer 210.

Figure 21:
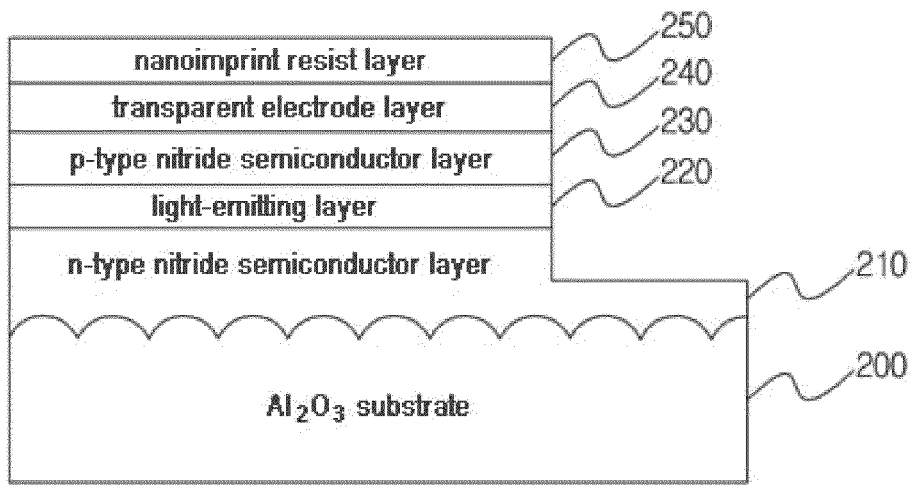
Figure 22:
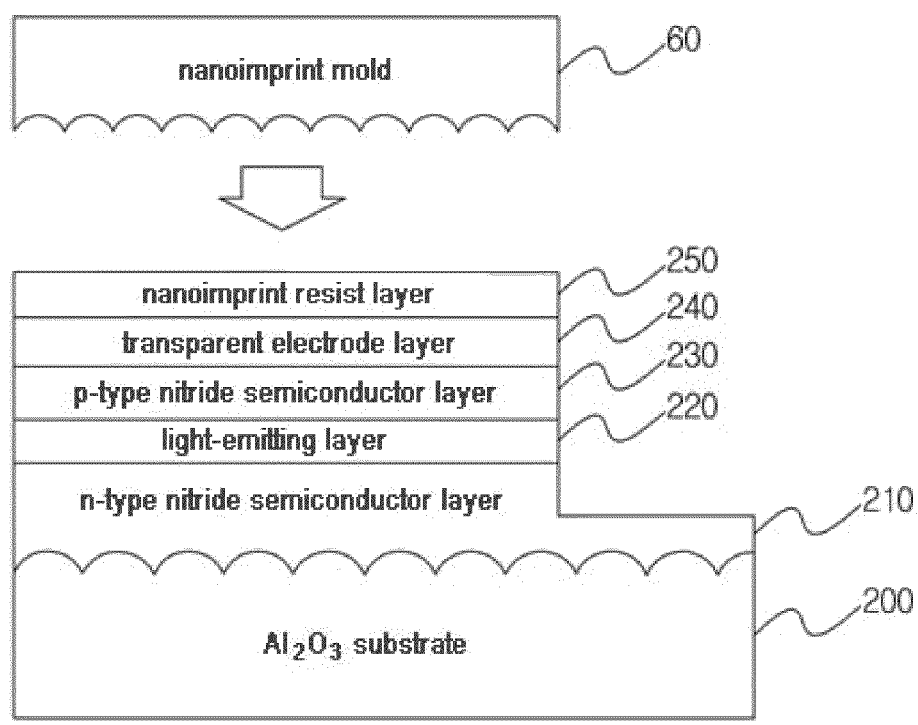

Referring to FIG. 21, the transparent electrode layer 240 is formed on the p-type nitride semiconductor layer 230 etched by the mesa-etching, and the nanoimprint resist layer 250 is formed on the transparent electrode layer 240 through a method of spin coating, for example. The transparent electrode layer 240 may include Indium Tin Oxide (ITO).

Figure 23:
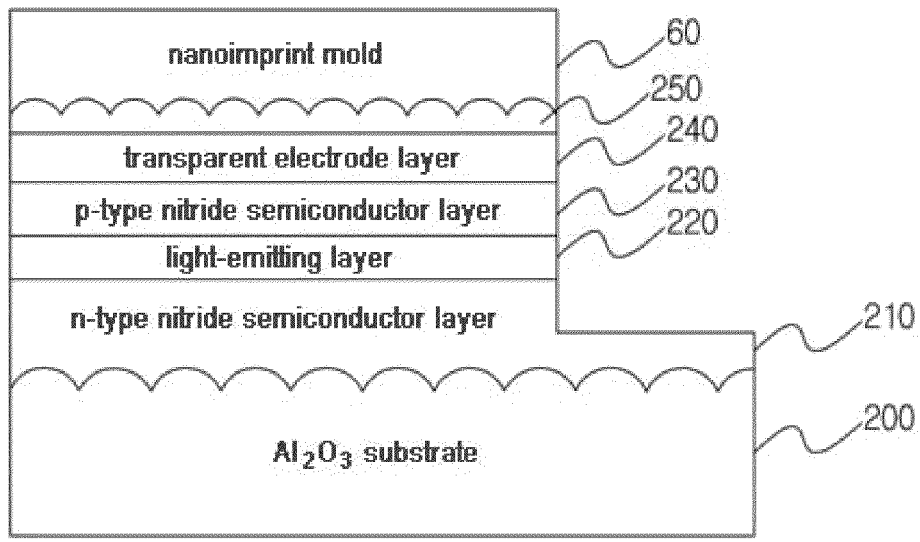

Referring to FIGS. 23 and 23, the nanoimprint mold 60 manufactured by the above-described method of manufacturing the nanoimprint mold according to an embodiment of the present invention is pressed onto the nanoimprint resist layer 250 to transfer the nano-pattern onto on the nanoimprint resist layer 250. Then, UV rays and heat are applied into the transferred nanoimprint resist layer 250 to cure the nanoimprint resist layer 250 having the hemispherical-shaped nano-pattern.

Figure 24:
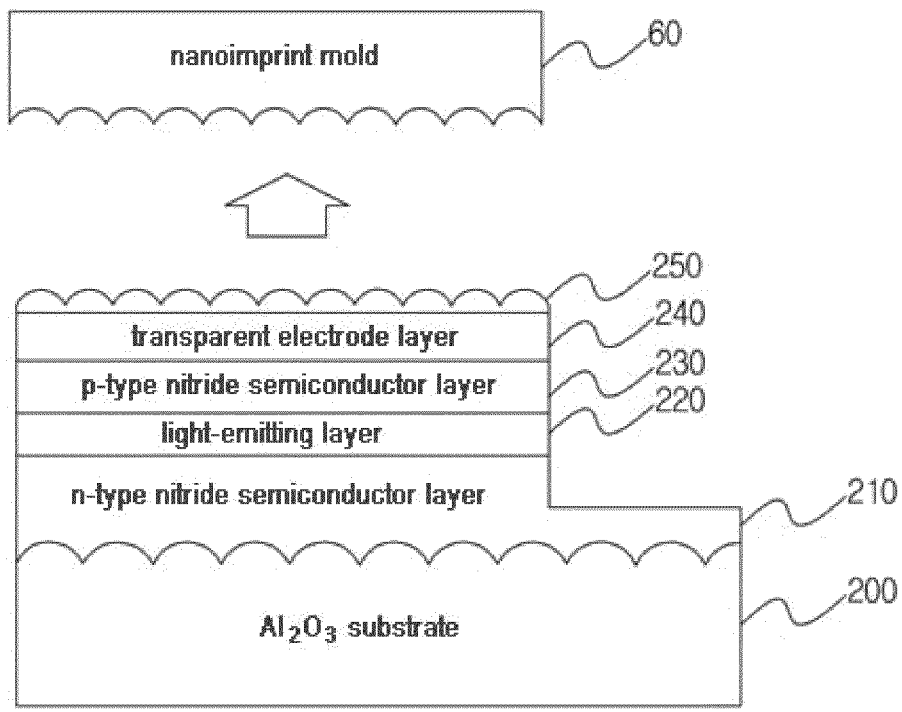

After that, referring to FIG. 24, the nanoimprint mold 60 is separated from the nanoimprint resist layer 250 having the hemispherical-shaped nano-pattern.

Figure 25:
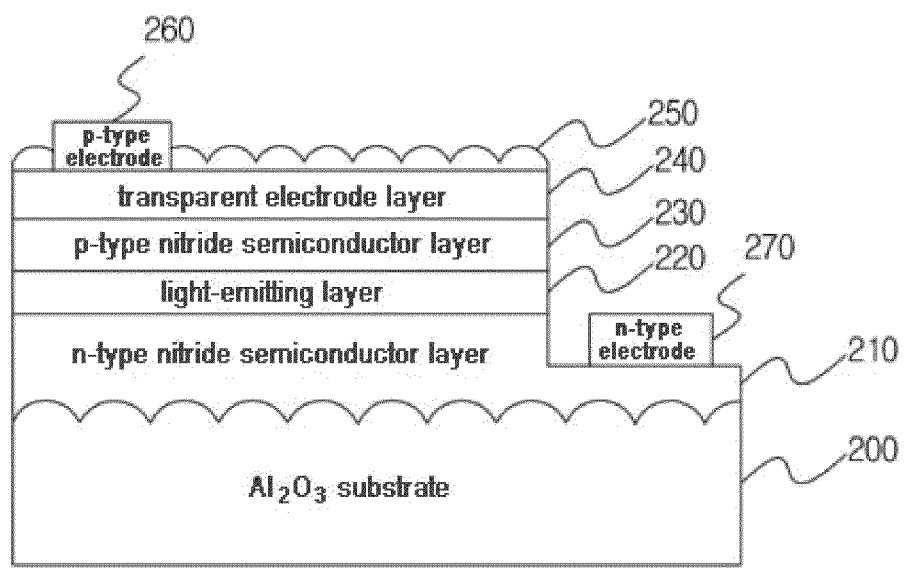

Referring to FIG. 25, a portion of the nanoimprint resist layer 250 having the hemispherical-shaped nano-pattern is etched for exposing the n-type nitride semiconductor layer 210, and then, the p-type electrode 260 is formed on the portion of the p-type electrode 260, and the n-type electrode 270 is formed on the n-type nitride semiconductor layer 210. For example, the n-type electrode 270 etches a portion of the nanoimprint resist layer 250 having the hemispherical-shaped nano-pattern to expose the transparent electrode layer 240, and may then be formed on an etched region by removing a conductive material, and the n-type electrode 270 is formed on the n-type nitride semiconductor layer 210 remained after the mesa-etching.

As described above, although the preferred embodiments of the present invention are described with reference to the accompanying drawings, the present invention is not limited to specific embodiments. Also, it will be understood by those skilled in the art that various changes and imitation in form and details may be made therein without departing from the spirit and scope of the invention as defined by the appended claims.

The invention claimed is:

1. A method of manufacturing a light emitting diode, the method comprising:
    (a) manufacturing a nanoimprint mold, comprising:
        (a1) coating nano structures on the semiconductor substrate;
        (a2) forming a nano-pattern having a hemispherical shape on the semiconductor substrate through a dry etching process using the nano structures as masks;
        (a3) transferring the hemispherical-shaped nano-pattern formed on the semiconductor substrate onto a nanoimprint mold in a nanoimprinting manner; and
        (a4) separating the nanoimprint mold on which the hemispherical shape is transferred from the semiconductor substrate;
    (b) forming an n-type nitride semiconductor layer, a light emitting layer, and a p-type nitride semiconductor layer on a temporary substrate;
    (c) forming a p-type electrode on the p-type nitride semiconductor layer;
    (d) forming a conductive substrate on the p-type electrode;
    (e) removing the temporary substrate to expose the n-type nitride semiconductor layer;
    (f) forming a nanoimprint resist layer on the n-type nitride semiconductor layer;
    (g) pressing the nanoimprint mold manufactured by the step of (a) on the nanoimprint resist layer to transfer the hemispherical-shaped nano-pattern formed on the nanoimprint mold onto the nanoimprint resist layer;
    (h) separating the nanoimprint mold from the nanoimprint resist layer having the nano-pattern having the hemispherical shape;
    (i) etching a portion of the nanoimprint resist layer having the nano-pattern having the hemispherical shape to form an n-type electrode; and
    (j) forming a refractive index adjustment layer between the n-type nitride semiconductor layer and the nanoimprint resist layer, wherein the refractive index adjustment layer has a refractive index less than that of the n-type nitride semiconductor layer and greater than that of the nanoimprint resist layer,
    wherein the refractive index adjustment layer is formed by sequentially stacking a first refractive index adjustment layer and a second refractive index adjustment layer which refract light emitted from the light emitting layer by refractive indexes different from each other,
    wherein the first refractive index adjustment layer is formed on the n-type nitride semiconductor layer and has a refractive index less than that of the n-type nitride semiconductor layer, and
    the second refractive index adjustment layer is formed on the first refractive index adjustment layer and has a refractive index less than that of the first refractive index adjustment layer and greater than that of the nanoimprint resist layer.

2. The method of claim 1, wherein the first refractive index adjustment layer comprises at least one selected from the group consisting of ZnO, Al-doped ZnO, In-doped ZnO, Ga-doped ZnO, $ZrO_2$, $TiO_2$, $SiO_2$, SiO, $Al_2O_3$, CuOX, and ITO.

3. The method of claim 1, wherein the second refractive index adjustment layer comprises MgO-based oxide.

4. The method of claim 3, wherein the MgO-based oxide forming the second refractive index adjustment layer is a multinary-compound formed by adding the other elements in MgO.

5. The method of claim 1, wherein the n-type electrode is formed by depositing a conductive material on an etched area after a portion of the nanoimprint resist layer having the nano-pattern is etched to expose the n-type nitride semiconductor layer.

6. A light emitting diode manufactured by the method of claim 1.

* * * * *